United States Patent [19]

Iwata

[11] Patent Number: 4,764,693

[45] Date of Patent: Aug. 16, 1988

[54] SEMICONDUCTOR SENSE CIRCUIT SUITABLE FOR BUFFER CIRCUIT IN SEMICONDUCTOR MEMORY CHIP

[75] Inventor: Yoshihisa Iwata, Yokohama, Japan

[73] Assignee: Kabushiki Kaisha Toshiba, Kawasaki, Japan

[21] Appl. No.: 48,813

[22] Filed: May 12, 1987

[30] Foreign Application Priority Data

May 19, 1986 [JP] Japan .................................. 61-114156

[51] Int. Cl.[4] .................. H03K 17/04; H03K 17/687; H03K 19/01; H03K 3/356

[52] U.S. Cl. .................................... 307/530; 307/475; 307/355; 307/605; 365/205; 365/207; 365/196

[58] Field of Search ............... 307/530, 475, 449, 463, 307/450, 451, 452, 269, 355, 362, 594, 596, 597, 601, 602, 603, 605, 279, 242; 365/203, 205, 206, 207, 189, 191, 195, 196

[56] References Cited

U.S. PATENT DOCUMENTS

| 4,150,441 | 4/1979 | Ando ................................. 365/189 |
| 4,165,541 | 8/1979 | Varshney et al. ............... 307/475 X |
| 4,397,000 | 8/1983 | Nagami .......................... 307/242 X |
| 4,645,954 | 2/1987 | Schuster .............................. 307/475 |

FOREIGN PATENT DOCUMENTS 56-134385 10/1981 Japan ................................... 307/530
60-76087 4/1985 Japan ................................... 307/530

Primary Examiner—Stanley D. Miller
Assistant Examiner—David R. Bertelson
Attorney, Agent, or Firm—Oblon, Fisher, Spivak, McClelland & Maier

[57] ABSTRACT

A sense circuit for use in a semiconductor memory senses an input signal by comparing the input signal with a reference voltage. The sense circuit comprises a sense amplifier having first and second nodes, and first and second transfer gates. The first transfer gate couples the input signal to the first node of the sense amplifier. The second transfer gate couples the reference voltage to the second node of the sense amplifier. A level-shift circuit is provided between the second node of the sense amplifier and the second transfer gate. In response to the voltage level of the input signal latched in the first node, the level-shift circuit shifts the level of the reference voltage latched in the second node of the sense amplifier to a lower level when the input signal is high in voltage level, and shifts it to a higher level when the input signal is low in voltage level.

8 Claims, 7 Drawing Sheets

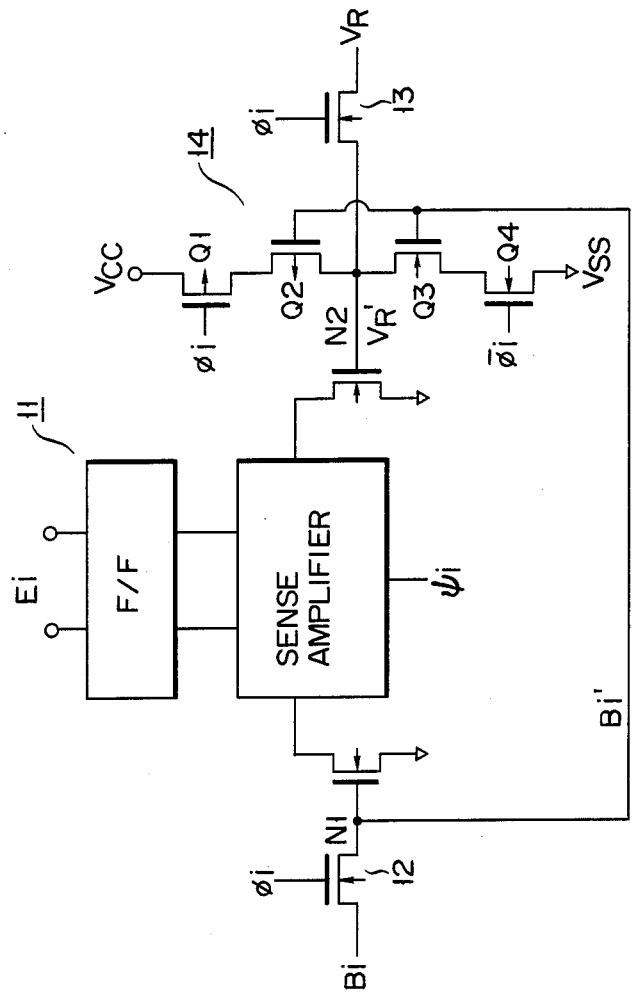
F I G. 3

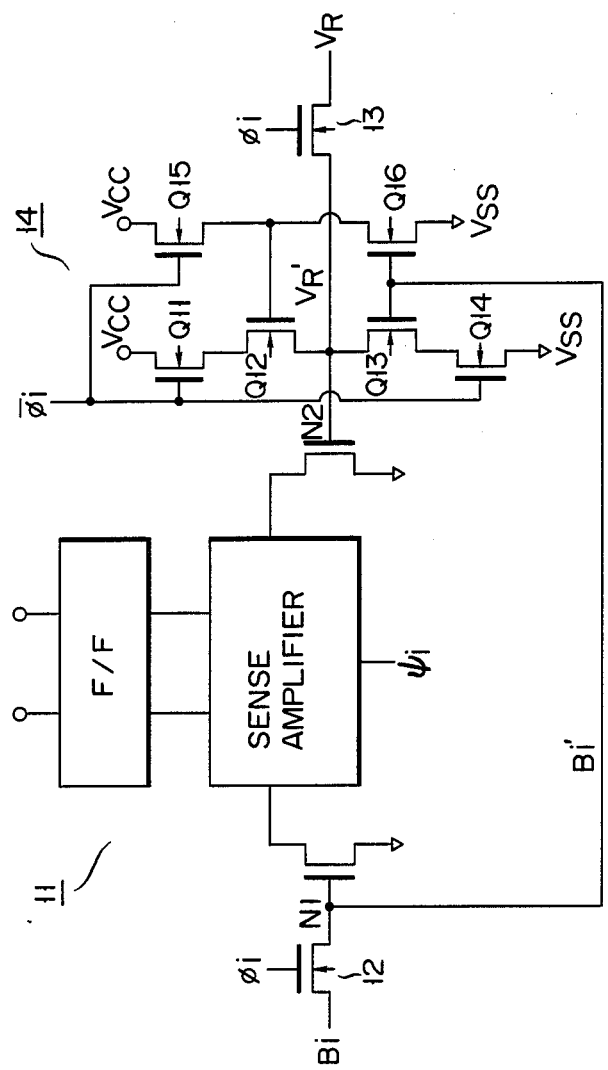
F I G. 5

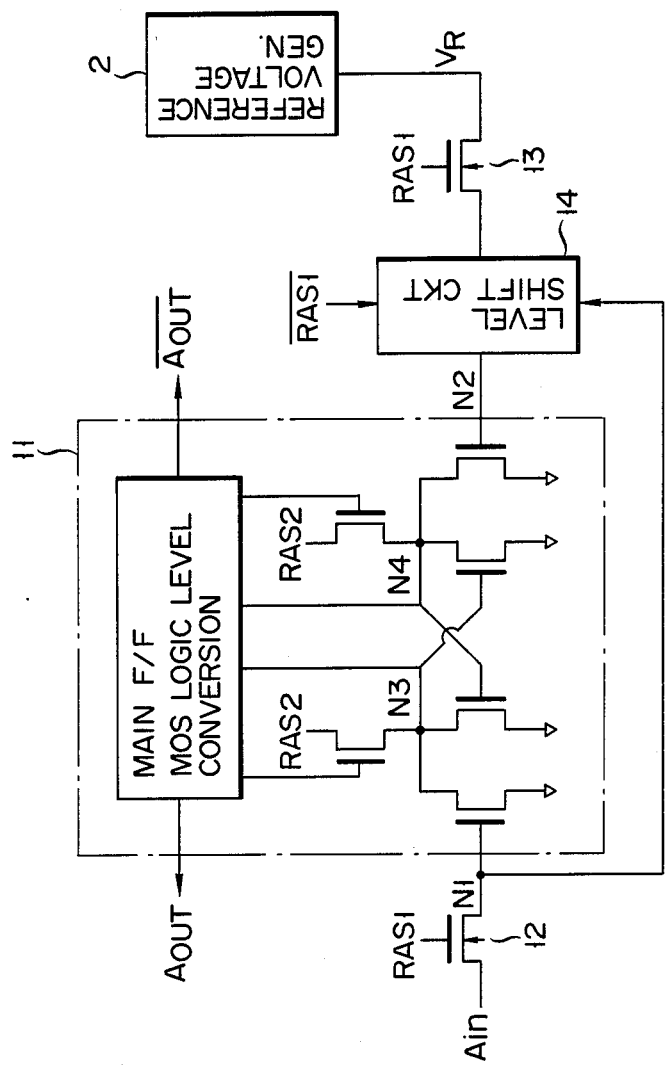
F I G. 6

SEMICONDUCTOR SENSE CIRCUIT SUITABLE FOR BUFFER CIRCUIT IN SEMICONDUCTOR MEMORY CHIP

BACKGROUND OF THE INVENTION

This invention relates to a sense circuit suitable for various buffer circuits in a semiconductor memory.

At present, a large-scale dynamic random-access memory (dRAM) is formed of MOS (metal oxide semiconductor) transistors. External logic circuits, which apply input signals and control signals to such a semiconductor memory, are usually formed of bipolar transistors. The semiconductor memory is operated at MOS logic signal levels, while the external logic circuits are operated at TTL (transistor-to-transistor logic) signal levels. In the MOS logic-level system used in the MOS semiconductor memory, a "HIGH" level of signals is set to a high level Vcc of a power source voltage, for example, +5 volts, while a "LOW" level is set to a low level Vss (ground) of the power source voltage. In the TTL level system used in the external logic circuits, a "HIGH" level of logic signals ranges from +2.4 to +6.5 volts, and a "LOW" level ranges from −1 to +0.8 volt. Since the external logic circuits and the semiconductor memory are different in the logic levels of signals, as described above, buffer circuits are required in the semiconductor memory, in order to convert the TTL signal levels into the MOS logic signal levels. Such buffer circuits may be classified into an address buffer circuit for an address input signal, a data input buffer circuit for a data input signal, and a control signal buffer circuit for a control signal. Among them, the address buffer circuit is typical.

A well known buffer circuit comprises a sense amplifier having first and second inputs (nodes), and first and second transfer gates. An externally applied input signal is coupled to the first input of the sense amplifier via the first transfer gate. A common reference voltage source is coupled to the second input of the sense amplifier via the second transfer gate. The externally applied input signal makes excursions between high and low levels. The reference voltage is set to a predetermined voltage level which is almost midway between the high and low levels of the input signal.

The first and second transfer gates are clocked by a common clock signal (control signal). As a result, the input signal and the reference voltage are latched in the first and the second inputs of the sense amplifier, respectively. By comparing the input signal voltage level with the reference voltage level, the sense amplifier senses the input signal, and amplifies it. Usually the sense amplifier provides complementary outputs. With the prior art buffer circuit, since the reference voltage is set to a fixed level, if a variation in the voltage level of an input signal occurs, a difference in level between the input signal voltage and the reference voltage would be decreased, which might possibly reduce an operational margin of the buffer circuit.

To solve the above problem, improved buffer circuits have been proposed.

With a circuit disclosed in Japanese Patent Disclosure (kokai) No. 56-134385, a reference voltage source is designed to generate a reference voltage whose level is midway between the "HIGH" and "LOW" levels in the TTL logic system, and vary the reference voltage level in opposite phase relation to a variation in the voltage level of the input signal.

The level-shift operation is performed outside a transfer gate, so that the level-shifted reference voltage is coupled to a node of a sense amplifier via the transfer gate. However, since the reference voltage varies with a change in the input signal, a finite delay will occur in the variation of the reference voltage. Accordingly, when the input signal is latched, if the reference voltage variation is not completed, the operational margin of the circuit becomes small.

An improved address buffer circuit is disclosed in Japanese laid open Patent Publication No. 56-134385.

In this address buffer circuit, a reference voltage source, which responds to an externally applied input signal, as in the above-mentioned buffer circuit, is designed to be operated by a control signal before the first and the second transfer gates are clocked. However, in order to operate the reference voltage source before the address signal is latched in the first input of the sense amplifier, it is required that a clocking timing of the first and the second transfer gates be delayed. This will reduce the margin for a row address hold time tRAH where the buffer circuit is used for a row address buffer circuit of a semiconductor memory.

SUMMARY OF THE INVENTION

An object of this invention is to provide a semiconductor sense amplifier which has a large operational margin.

A semiconductor sense circuit of this invention comprises a reference voltage generating circuit for providing a reference voltage at a predetermined level, a sense amplifier having first and second nodes for amplifying a potential difference between signals latched in the first and second nodes, and first and second transfer gates for transferring an input signal and the reference voltage provided from the reference voltage generating circuit to the first and second nodes of the sense amplifier, respectively, so that the input signal and the reference voltage are latched in the first and second nodes of the sense amplifier, respectively.

To achieve the above object, a level-shift circuit is connected between the second node of the sense amplifier and the second transfer gate, which shifts the level of the reference voltage latched in the second node, in response to a voltage level of the input signal latched in the first node of the sense amplifier. The level-shift circuit shifts the level of the reference voltage to a level lower than the predetermined voltage level when the input signal latched in the first node of the sense amplifier is high, and to a level higher than the predetermined voltage level when the input signal is low.

BRIEF DESCRIPTION OF THE DRAWINGS

FIG. 3 shows a circuit configuration of the buffer circuit of FIG. 1 in which the shift level circuit is illustrated in a practical form;

FIG. 5 shows a circuit configuration of the buffer circuit in which the level-shift circuit is illustrated in another practical form;

FIG. 6 shows a row address buffer circuit according to this invention, which is used in a dRAM.

DETAILED DESCRIPTION OF THE PREFERRED EMBODIMENTS

Figure 1:
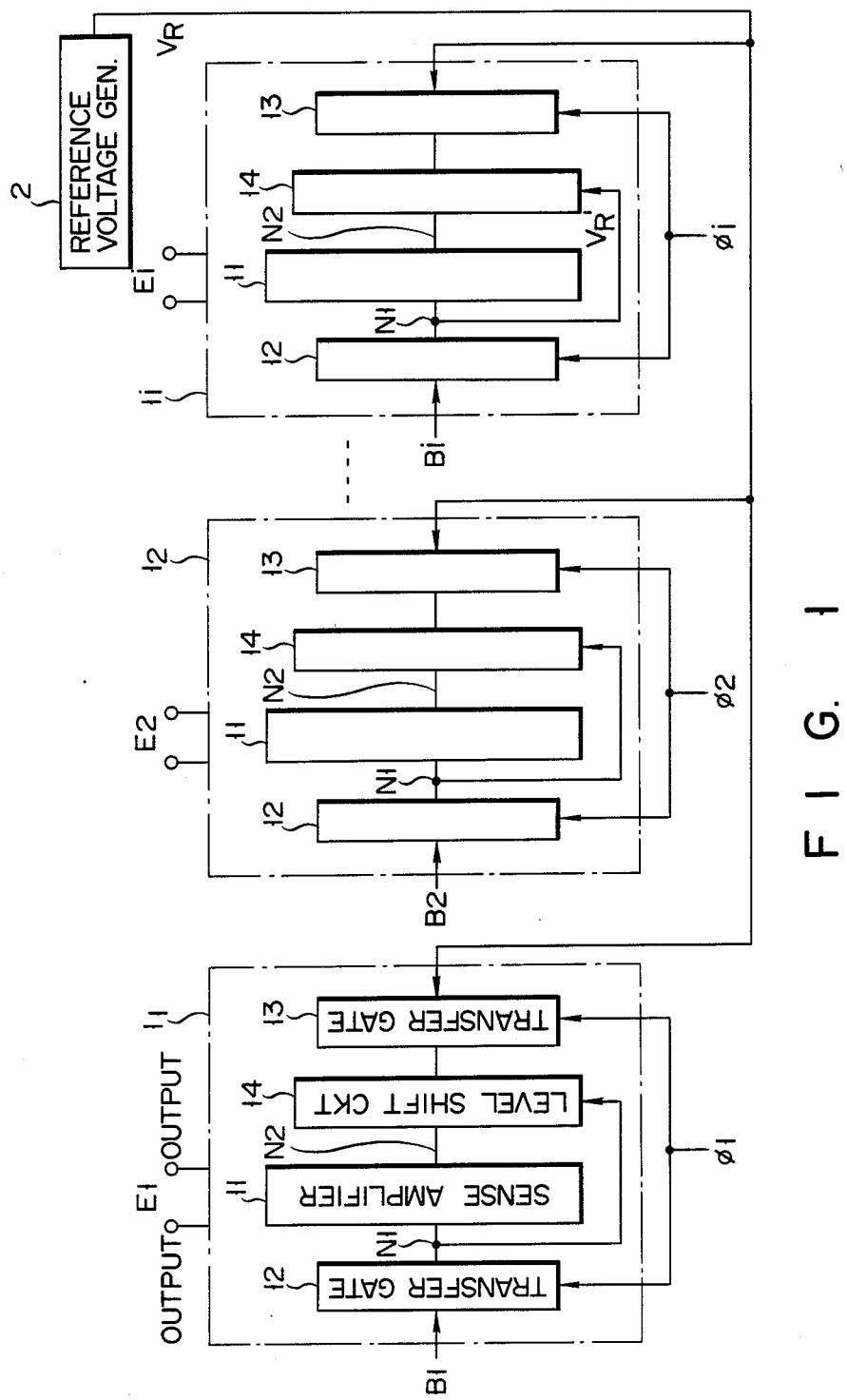
FIG. 1 shows a configuration of an embodiment of a buffer circuit according to this invention.

Referring to FIG. 1, buffer circuit (for example, an address buffer circuit used in dRAM) 1$i$ comprises sense amplifier 11, first transfer gate 12 and second transfer gate 13. First transfer gate 12 is adapted for latching an externally applied input signal Bi in first node N1 of sense amplifier 11. Second transfer gate 13 is adapted for latching a reference voltage in second node N2 of sense amplifier 11. Reference voltage generator 2 has a known configuration to provide a reference voltage VR (e.g. +1.6V) which is set to a fixed level between "HIGH" and "LOW" levels of the input signal Bi.

As shown, first and second transfer gates 12 and 13 are turned on and off by clock signal $\phi i$ (for example, RAS 1 control signal produced by a row address strobe signal in a memory chip). Level-shift circuit 14 is provided between second node N2 of sense amplifier 11 and second transfer gate 13. Level-shift circuit 14 is controlled by the potential of the input signal latched in first node N1. In accordance with a voltage level of the input signal latched in first node N1, level-shift circuit 14 shifts the level of the reference voltage VR latched in the second node of sense amplifier 11. In particular, the level-shift circuit is designed so as to shift the level of the reference voltage latched in second node N2 to a level lower than that of VR, when input signal Bi is high in level, and to a level higher than that of VR, when input signal Bi is low in level. The buffer circuits, the level-shift circuits, and the reference voltage generating circuit are integrated in a memory chip.

Figure 2:
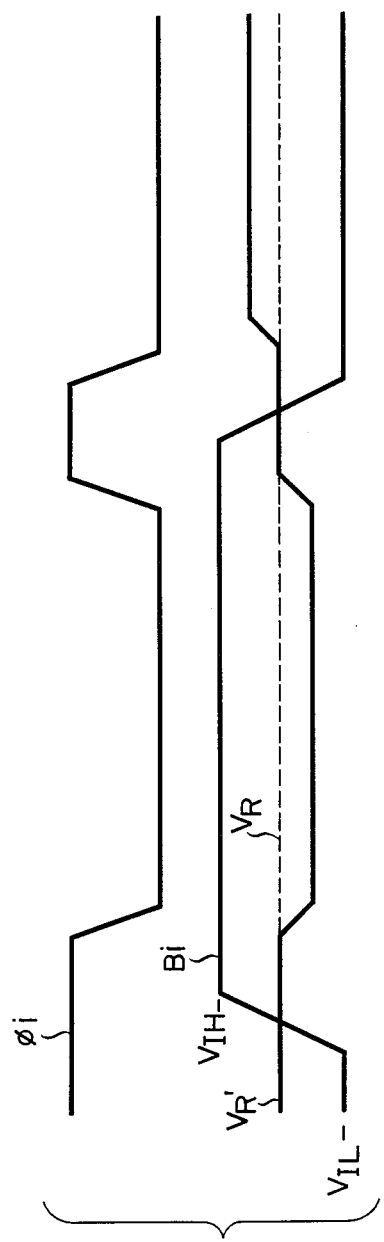
FIG. 2 shows a timing chart for explaining an operation of the buffer circuit of FIG. 1.

FIG. 2 is a signal waveform diagram for explaining an operation of the buffer circuit of FIG. 1. When clock signal $\phi i$ goes from a high to a low level, transfer gates 12 and 13 are turned off. As a result, address input signal Bi with one of TTL levels is latched in first node N1 of sense amplifier 11, and reference voltage VR', level-shifted by level-shift circuit 14, is latched in second node N2. As shown, when input signal Bi is high, reference voltage VR' latched in the second node is shifted to a level lower than that of fixed voltage VR provided from reference voltage generator 2. When input signal Bi is low, on the other hand, reference voltage VR' latched in second node N2 of the sense amplifier is shifted to a level higher than that of fixed voltage VR.

FIG. 3 shows a practical arrangement of level-shift circuit 14 suitable for use in a semiconductor memory formed of CMOS transistors. Level-shift circuit 14 is formed of a clocked CMOS circuit which is comprised of P-channel MOS transistors Q1 and Q2 and N-channel MOS transistors Q3 and Q4. The drain-to-source paths of P-channel transistors Q1 and Q2 are series-connected between a power source Vcc (+5V) and second node N2. The drain-to-source paths of N-channel transistors Q3 and Q4 are series-connected between a power source Vcc (ground) and second node N2 of the sense amplifier. Transistors Q1 and Q4 are respectively controlled by complementary clock signals $\phi i$ and $\bar{\phi}i$, which are applied to the respective gates thereof. Transistors Q2 and Q3 are controlled by a potential at first node N1 of sense amplifier 11. As shown, when first and second transfer gates 12 and 13 formed of N-channel transistors are on, clocked transistors Q1 and Q4 of level-shift circuit 14 are off. Conversely, when transfer gates 12 and 13 are off, clocked transistors Q1 and Q4 are on.

Figure 4:
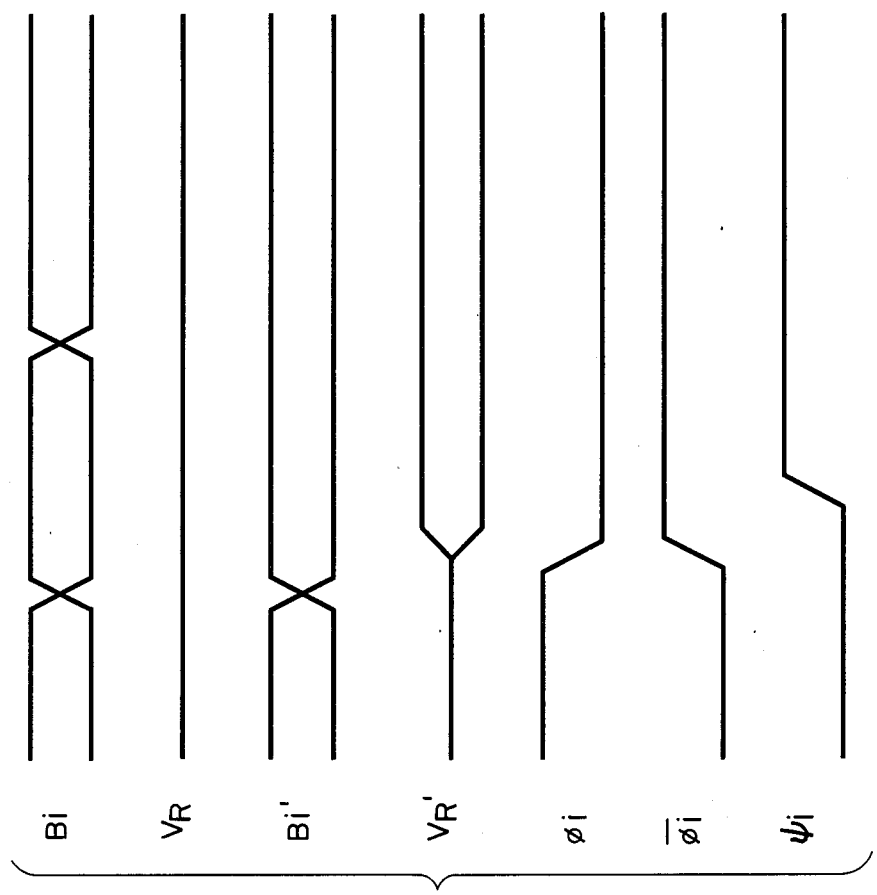
FIG. 4 is a signal waveform diagram for explaining an operation of the buffer circuit of FIG. 3.

FIG. 4 shows a signal waveform diagram for explaining an operation of the buffer circuit of FIG. 3. When clock signal $\phi i$ is high, transfer gates 12 and 13 are turned on. As a result, input signal Bi is coupled to first node N1 of sense amplifier 11, and reference voltage VR is coupled to second node N2. When clock signal $\phi i$ goes low, first and second transfer gates 12 and 13 are turned off, with a result that input signal Bi is latched in first node N1, and reference voltage VR is latched in second node N2. When clock signal $\phi i$ goes low, clocked transistors Q1 and Q4 of level-shift circuit 14 are turned on to operate the level-shift circuit. Under this condition, if potential Bi' on second node N1 is high, N-channel transistor Q3 is made more conductive than P-channel transistor Q2, so that the level of the reference voltage latched in second node N2 is shifted below reference voltage VR. If potential Bi' is low, transistor Q2 is made more conductive than Q3, so that the level of the reference voltage latched in node N2 is shifted above reference voltage VR. The sensing operation for the input signal is started by a sense amplifier-activating clock signal $\psi i$, which is generated later than clock signal $\phi i$.

With the above embodiment, even if the voltage level of an input signal with one of logic levels varies, a difference in level between the input signal and the reference voltage is large. Furthermore, since the level-shifting of the reference voltage is performed on the basis of the voltage level of an input signal latched in the node of the sense amplifier, the operational margin for signal delays is sufficiently large. A margin of the hold time required to latch data is not adversely affected.

FIG. 5 shows a level-shift circuit comprised of only N-channel transistors, which is suitable for a semiconductor memory formed of N-channel transistors. In this level-shift circuit, MOS transistors Q11 and Q12 are connected in series between node N2 and power source Vcc. MOS transistors Q13 and Q14 are connected in series between node N2 and power source Vss. MOS transistors Q15 and Q16 are connected in series between power sources Vcc and Vss, with the connection node thereof coupled to the gate of transistor Q12. To the gates of transistors Q11, Q14, Q15 is applied clock signal $\bar{\phi}i$, which is complementary to clock signal $\phi i$ applied to transfer gates 12 and 13. The gates of transistors Q13 and Q16 are coupled together to node N1.

Like the above-mentioned level-shift circuit, this level-shift circuit is operated when transfer gates 12 and 13 are turned off, that is, the input signal and the reference voltage are latched in first and second nodes N1 and N2, respectively. Under this condition, transistors Q11 and Q14 are on, and transistor Q15 is conductive. When potential Bi' on node N1 is high, transistors Q13 and Q16 will turn on. Mutual conductances gm of transistors Q15 and Q16 are so determined that transistor Q12 is turned off at this time. Specifically, it is required that transistors Q15 and Q16 be formed to have different mutual conductances so that transistor Q16 is made more conductive than transistor Q15 when clock signal $\bar{\phi}i$ and potential Bi' are high. Then, the level of reference voltage VR latched in node N2 is shifted toward Vss (ground). The ratio of the mutual conductance of transistor Q16 to that of transistor Q15 may be set to about four. On the other hand, when potential Bi' of the input signal latched in node N1 is low, transistors Q13 and Q16 are rendered nonconductive. As a result, transistor Q12 is made more conductive, since Q15 is conductive. This shifts the level of the reference voltage latched in node N2 toward Vcc (+5 volts).

FIG. 6 shows an address buffer circuit according to this invention, which is used in a dRAM. Sense amplifier 11 has a known configuration. As level-shift circuit 14, the above-mentioned circuit is used. In the figure, the same components as those described earlier are denoted by the same reference numerals, and their description will therefore be omitted.

The operation of the address buffer circuit of FIG. 6 will now be described, with reference to FIG. 7.

Figure 7:
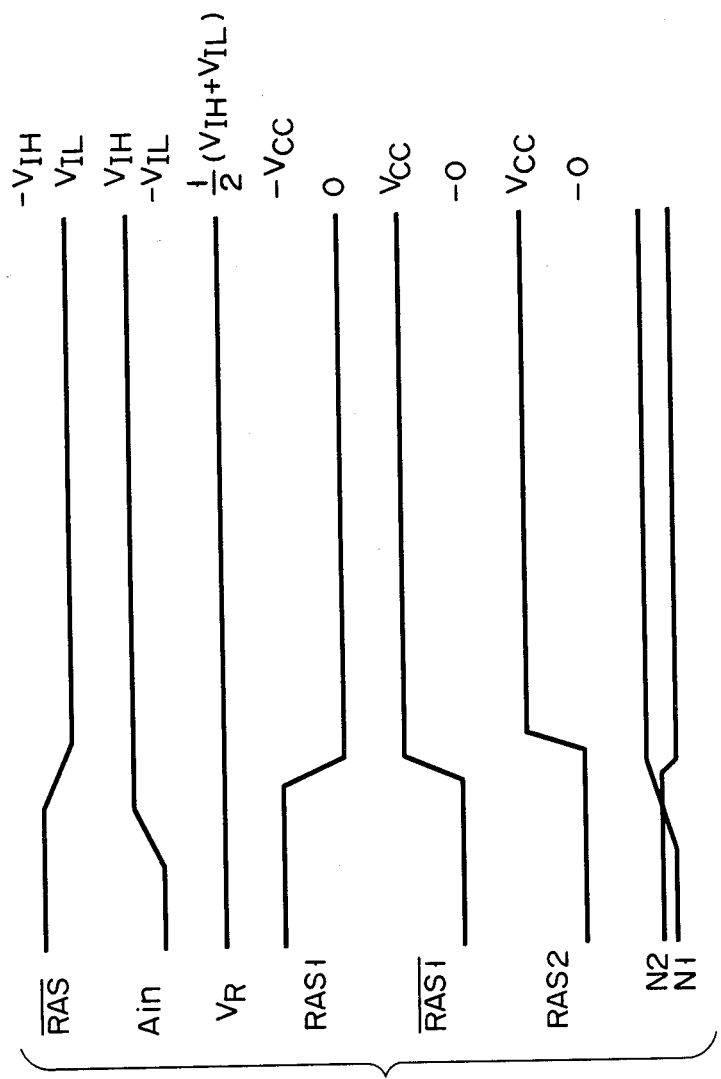
FIG. 7 is a signal waveform diagram for explaining an operation of the address buffer circuit of FIG. 6.

In FIG. 7, $\overline{RAS}$ is a control signal used outside the semiconductor memory chip, for performing a read/write operation of the memory. When this signal goes low, the memory is accessed. Control signals RAS1 and RAS2 are generated in the memory chip, on the basis of control signal $\overline{RAS}$. When control signal RAS goes low, control signal RAS1 goes low, and control signal RAS2 goes high. Control signal RAS2 corresponds to sense amplifier-activating clock signal $\psi i$ which is used in the above-mentioned buffer circuit.

When control signal $\overline{RAS1}$ goes low slightly late, the time at which control signal $\overline{RAS}$ goes low, transfer gates 12 and 13 are turned off. As a result, address bit signal Ain and reference voltage VR are respectively latched in first and second nodes N1 and N2. Simultaneously, level-shift circuit 14 operates to shift the level of reference voltage VR latched in second node N2. Then, control signal RAS2 goes high to activate sense amplifier 11. This causes a difference in potential between nodes N3 and N4 of sense amplifier 11. The potential difference is amplified by a flip-flop, and transferred to a MOS logic level-conversion section for providing complementary outputs Aout and $\overline{Aout}$ in the MOS logic-level system.

FIG. 6 shows, by way of example, an address buffer circuit used for a row address buffer circuit in a dRAM. In general, an address-multiplexing system is used in a dRAM, wherein a row address input signal is input through a group of address pins of a memory chip, in response to control signal $\overline{RAS}$, and subsequently, a column address input signal is input through the same group of address pins, in response to control signal $\overline{CAS}$. Thus, the memory chip includes a column address buffer circuit having the same configuration as the above-mentioned row address buffer circuit. This invention is also applicable to a data input buffer circuit.

What is claimed is:

1. A semiconductor sense circuit comprising:
a reference voltage generating circuit for providing a reference voltage of a predetermined level;
a sense amplifier, having first and second nodes, for amplifying a potential difference between signal voltages latched in said first and second nodes;
first and second transfer gates for transferring an input signal and a reference voltage from said reference voltage generating circuit to first and second nodes of said sense amplifier, respectively, so that the input signal and the reference voltage are latched in said first and second nodes of said sense amplifier, respectively; and
a level-shift circuit connected between said second node of said sense amplifier and said second transfer gate, and responsive to a voltage level of the input signal latched in said first node of said sense amplifier, for shifting the level of the reference voltage latched in said second node of said sense amplifier, said level-shift circuit shifting the level of the reference voltage latched in said second node of said sense amplifier to a level lower than the predetermined level when the input signal latched in said first node of said sense amplifier is high in voltage level, and to a level higher than the predetermined level when the input signal latched in said first node is low in voltage level.

2. The sense circuit according to claim 1, further comprising:
means for supplying control signals to said first and second transfer gates and said level-shift circuit, so that the input signal and the reference voltage are latched in said first and second nodes of said sense amplifier, respectively, when said first and second transfer gates are turned off, and said level-shift circuit shifts the level of the reference voltage latched in said second node when said first and second transfer gates are turned off.

3. The sense circuit according to claim 1, wherein said level-shift circuit is formed of complementary MOS transistors.

4. The sense circuit according to claim 1, wherein said level-shift circuit is formed of N-channel MOS transistors.

5. The sense circuit according to claim 1, wherein said level-shift circuit comprises first and second P-channel MOS transistors, and third and fourth N-channel MOS transistors, drain-to-source paths of said first, second, third, and fourth transistors being series-connected, in this order, across a power source, a connection point of said second and third transistors being connected to said second node of said sense amplifier, and gates of said second and third transistors being connected together to said first node of said sense amplifier,
and further comprising:
means for applying control signals to said first and second transfer gates and gates of said first and fourth transistors, so that said first and fourth transistors are turned on when said first and second transfer gates are turned off.

6. The sense amplifier according to claim 1, wherein said level-shift circuit comprises first to sixth N-channel MOS transistors, drain-to-source paths of said first to fourth transistors being series-connected, in this order, across a power source, drain-to-source paths of said fifth and sixth transistors being series-connected across the power source, a connection point of said second and third transistors being connected to said second node of said sense amplifier, a connection point of said fifth and sixth transistors being connected to a gate of said second transistor, and gates of said third and sixth transistors being connected together to said first node of said sense amplifier, and
further comprising:
means for supplying control signals to said first and second transfer gates and gates of said first, fourth, and fifth transistors, so that said first, fourth, and fifth transistors are turned on when said first and second transfer gates are turned off.

7. An address buffer circuit for sensing an address signal addressing a semiconductor memory, the address signal consisting of a plurality of bits, comprising:
a plurality of sense circuits formed in a semiconductor memory chip, for sensing the respective bits of an externally applied address signal; and a common reference voltage generating circuit formed in said semiconductor memory chip, for providing a reference voltage of a predetermined level;

each of said plurality of sense circuits comprising:

a sense amplifier, having a first and a second node, for amplifying a potential difference between signal voltages latched in said first and second nodes;

first and second transfer gates for transferring an input signal for a corresponding bit of the address signal and the reference voltage from said reference voltage generating circuit to said first and second nodes of said sense amplifier, respectively, so that the input signal and the reference voltage are latched in said first and second nodes of said sense amplifier, respectively; and a level-shift circuit connected between said second node of said sense amplifier and said second transfer gate, and responsive to a voltage level of the input signal latched in said first node of said sense amplifier, for shifting the level of the reference voltage latched in said second node of said sense amplifier, said level-shift circuit shifting the level of the reference voltage latched in said second node of said sense amplifier to a level lower than the predetermined level of the reference voltage when the input signal latched in said first node of said sense amplifier is high in voltage level, and shifting the level of the reference voltage latched in said second node to a level higher than the predetermined level of the reference voltage when the input signal latched in said first node is low in voltage level.

8. A semiconductor sense circuit comprising;

a reference voltage generating circuit for providing a reference voltage of a predetermined level;

a sense amplifier, having a first and a second node, for amplifying a potential difference between signal voltages latched in said first and second nodes;

first and second transfer gates for transferring an input signal and the reference voltage to said first and second nodes of said sense amplifier, respectively, so that the input signal and the reference voltage are latched in said first and second nodes of said sense amplifier, respectively; and a level-shift circuit connected between said second node of said sense amplifier and said second transfer gate, and responsive to a voltage level of the input signal latched in said first node of said sense amplifier, for shifting the level of the reference voltage latched in said second node of said sense amplifier.

* * * * *